(12) United States Patent
Kyung

(10) Patent No.: US 6,438,015 B2
(45) Date of Patent: Aug. 20, 2002

(54) SEMICONDUCTOR MEMORY DEVICE AND MEMORY SYSTEM FOR IMPROVING BUS EFFICIENCY

(75) Inventor: Kye-hyun Kyung, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/829,803

(22) Filed: Apr. 10, 2001

(30) Foreign Application Priority Data

Aug. 5, 2000 (KR) .......................................... 00-45455

(51) Int. Cl.[7] ................................................. G11C 5/06
(52) U.S. Cl. ....................... 365/63; 365/52; 365/189.03
(58) Field of Search ............................ 365/233, 63, 52, 365/191, 189.03

(56) References Cited

U.S. PATENT DOCUMENTS 4,884,237 A * 11/1989 Mueller et al. ............... 365/63
5,165,067 A * 11/1992 Wakefield et al. ........... 257/783
5,512,783 A * 4/1996 Wakefield et al. ........... 257/693

* cited by examiner

Primary Examiner—David Nelms
Assistant Examiner—Gene N. Auduong
(74) Attorney, Agent, or Firm—F. Chau & Associates, LLP

(57) ABSTRACT

Disclosed is a memory device, comprising a memory controller, a clock input pin for receiving a clock signal, a first chip selection signal input pin for receiving a first chip selection signal for a row address strobe from the memory controller, a second chip selection signal input pin for receiving a second chip selection signal for a column address strobe from the memory controller, a row command input pin for receiving a row command from the memory controller, a column command input pin for receiving a column command from the memory controller, a plurality of row address input pins for receiving row addresses from the memory controller, and a plurality of column address input pins for receiving column addresses from the memory controller.

13 Claims, 5 Drawing Sheets

SEMICONDUCTOR MEMORY DEVICE AND MEMORY SYSTEM FOR IMPROVING BUS EFFICIENCY

BACKGROUND OF THE INVENTION

1. Field of the Invention

The present invention relates to a semiconductor memory device and a memory system, and more particularly, to a semiconductor memory device and a memory system for improving bus efficiency.

2. Description of the Related Art

Memory devices are typically developed to have a high density of integration and large capacity. Central processing units (CPU) are developed to achieve processing at high speed. The operating speed of large memory devices is usually slower than the speed of the CPUs. As a result, there arises a gap between the operating speeds of CPUs and memory devices. The slower operating speeds of memory devices restrict the overall performance of computer systems. In order to achieve speedy memory systems, high-speed memory devices must be developed and the bus efficiency thereof improved.

Synchronous DRAMs are among the fastest large-scale memory devices. However, in synchronous DRAMs, in order to reduce the number of pins, a row command (RAS) and a column command (CAS) must share an address, and a host of commands must be applied simultaneously with a chip selection signal CS. Hence, synchronous DRAMs degrade the bus efficiency of memory systems and consequently restrict the performance of memory systems.

FIG. 1 shows the pin configuration of a conventional synchronous DRAM, and FIG. 2 shows a memory system adopting the conventional synchronous DRAM of FIG. 1. In FIG. 1, only pins associated with data input and output are shown, and pins are arranged in an arbitrary order.

Referring to FIG. 1, a conventional synchronous DRAM 100 includes an input pin 11 for receiving a clock signal CK, an input pin 12 for receiving a clock enable signal CKE, an input pin 13 for receiving a chip selection signal CS, an input pin 14 for receiving a row address strobe signal RASB, an input pin 15 for receiving a column address strobe signal CASB, and an input pin 16 for receiving a write enable signal WEB. Also, the conventional synchronous DRAM 100 includes a plurality of address input pins 17-1 through 17-n for receiving addresses Ai (where i is an integer from 1 to n), and a plurality of data input and output pins 18-1 through 18-n for receiving data DQi (where i is an integer from 1 to n).

The clock enable signal CKE, the chip selection signal CS, the row address strobe signal RASB, the column address strobe signal CASB, and the write enable signal WEB are referred to as command signals, and are generated by a memory controller 23 shown in FIG. 2. The memory controller 23 also generates the clock signal CK and the addresses Ai. The data DQi is output from the memory controller 23 during a write operation, and output from the synchronous DRAM 100 during a read operation. In the conventional synchronous DRAM 100, row addresses and column addresses are received via the same input pins, that is, via the address input pins 17-1 through 17-n.

Referring to FIG. 2, a conventional memory system includes memory modules 21-1 through 21-4 on which a plurality of synchronous DRAMs M each having a pin configuration as shown in FIG. 1 are mounted, and the memory controller 23 for controlling the synchronous DRAMs M. In FIG. 2, RASB0, CASB0 and CS0 are for the memory module 21-1, RASB1, CASB1 and CS1 are for the memory module 21-2, RASB2, CASB2 and CS2 are for the memory module 21-3, and RASB3, CASB3 and CS3 are for the memory module 21-4.

FIG. 3 is a timing diagram illustrating a protocol used in the conventional memory system shown in FIG. 2 during a read operation; in particular, when data are consecutively read from memory modules 21-1 and 21-2 among the memory modules shown in FIG. 2.

In FIG. 3, it is assumed that tRCD, that is, the time of activation of RASB (that is, the transition from a logic "high" to a logic "low") to the time of activation of CASB, is two clock cycles (2T), that a column address strobe latency CL is two clock cycles (2T), and that a burst length BL is two clock cycles (2T).

However, in the conventional memory system shown in FIG. 2, when data is read from the two memory modules 21-1 and 21-2, there exists a time period in which there is no data on a data bus, such as during a clock cycle T8 as shown in FIG. 3. During such time, no command is issued in the conventional memory system and a "bubble" clock cycle T8 has to be added. Thus, the bus efficiency is degraded and the performance of the memory system is restricted. If the bubble cycle T8 is removed by advancing one clock cycle, it can be seen from FIG. 3 that a column address CA1 for the memory module 21-1 and a row address RA2 for the memory module 21-2 must be concurrently applied. According to the conventional memory design and protocol, the column address lines are shared with the row address and application of concurrent CA1 and RA2 addresses will result in an erroneous read operation. A need therefore exists for a semiconductor memory device having improved bus efficiency.

SUMMARY OF THE INVENTION

The present invention provides a semiconductor memory device comprising a clock input pin for receiving a clock signal; a first chip selection signal input pin for receiving a first chip selection signal for a row address strobe from the memory controller; a second chip selection signal input pin for receiving a second chip selection signal for a column address strobe from the memory controller; a row command input pin for receiving a row command from the memory controller; a column command input pin for receiving a column command from the memory controller; a plurality of row address input pins for receiving row addresses from the memory controller; and a plurality of column address input pins for receiving column addresses from the memory controller, wherein the row command and the column command are received in response to two consecutive edges of the clock signal.

The first data of the first chip selection signal received in response to the first edge of the clock signal is recognized as a chip selection signal, and the second data of the first chip selection signal received in response to the second edge next to the first edge is recognized as a row command. The first data of the second chip selection signal received in response to the first edge of the clock signal is recognized as a chip selection signal, and the second data of the second chip selection signal received in response to the second edge of the clock signal, which is next to the first edge of the first signal, is recognized as a column command.

The present invention provides a memory system having memory modules on which a plurality of semiconductor memory devices are mounted, and a memory controller for controlling the semiconductor memory devices, wherein each of the semiconductor memory devices separately includes: a first chip selection signal input pin for receiving a first chip selection signal for a row address strobe; and a second chip selection signal input pin for receiving a second chip selection signal for a column address strobe, wherein the first and second chip selection signals are generated by the memory controller and transmitted to each of the memory modules via different bus lines.

Each of the semiconductor memory devices further comprises a row command input pin for receiving a row command; and a column command input pin for receiving a column command, wherein a bus line for transmitting the row command is separated from a bus line for transmitting the column command.

Each of the semiconductor memory devices further comprises a plurality of row address input pins for receiving row addresses; and separately a plurality of column address input pins for receiving column addresses, wherein bus lines for transmitting the row addresses are separated from bus lines for transmitting the column addresses.

BRIEF DESCRIPTION OF THE DRAWINGS

The advantages and features of the present invention will become more apparent in view of the detail description of the invention when read with reference to the drawings in which.

DESCRIPTION OF PREFERRED
EMBODIMENTS OF THE INVENTION

Figure 1:
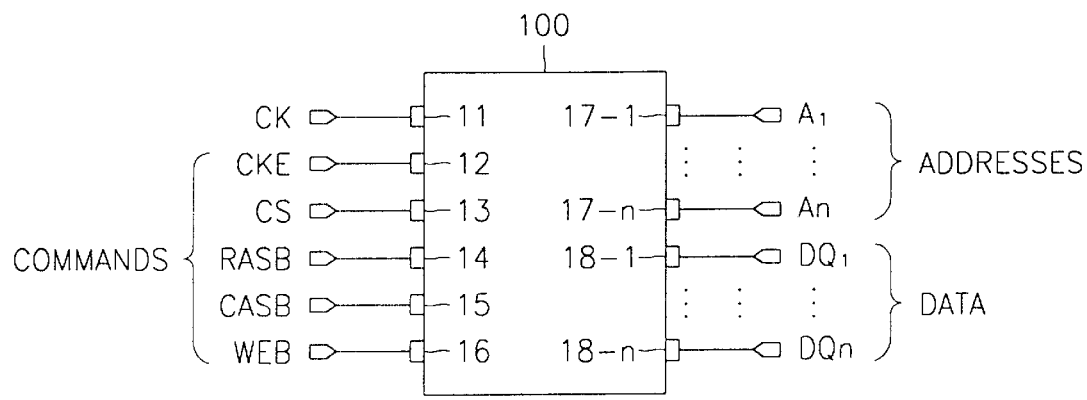
FIG. 1 shows a common pin configuration of a conventional synchronous DRAM.
Figure 2:
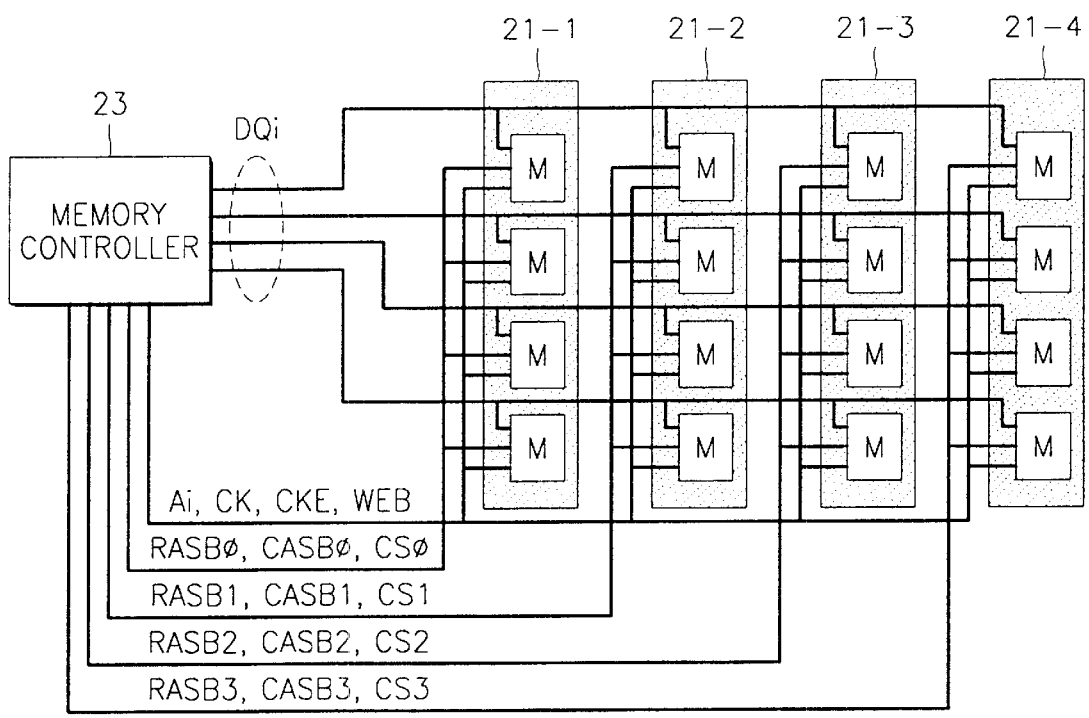
FIG. 2 shows a memory system having the conventional synchronous DRAM shown in FIG. 1.
Figure 3:
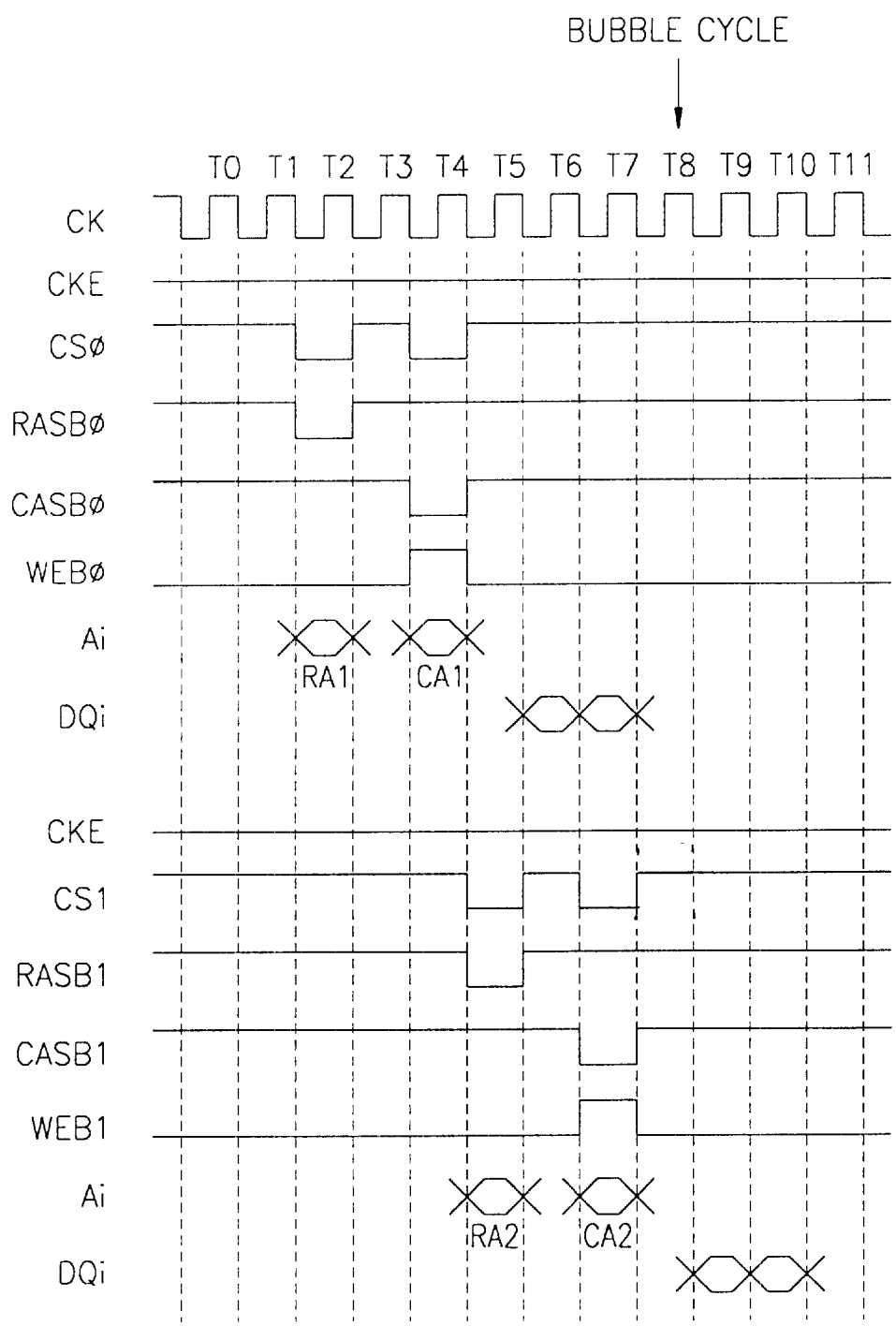
FIG. 3 is a timing diagram illustrating a protocol for a read operation of the conventional memory system shown in FIG. 2.
Figure 4:
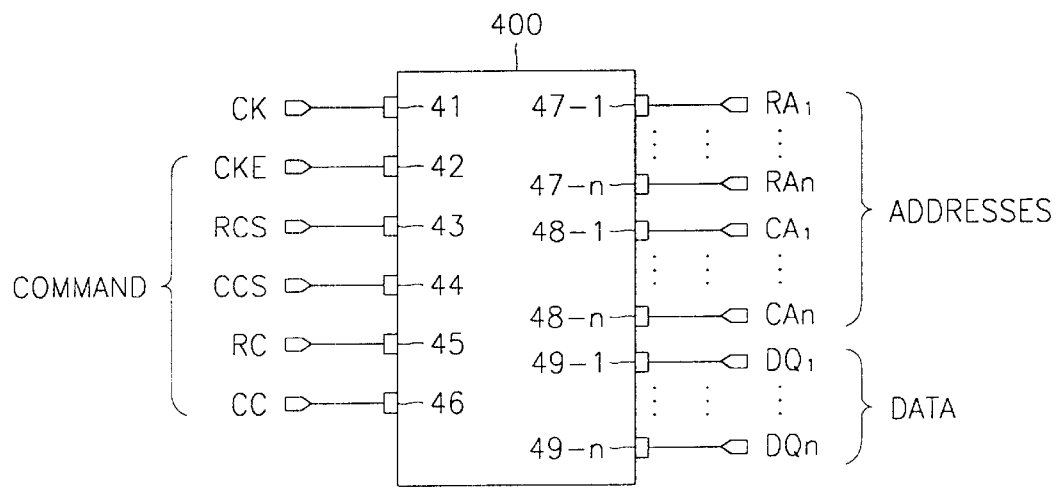
FIG. 4 illustrates a pin configuration of a semiconductor memory device according to the present invention.

Referring to FIG. 4, a semiconductor memory device 400 according to the present invention is a dynamic random access memory (DRAM) having an illustrative pin configuration which includes a first chip selection signal input pin 43 for receiving a first chip selection signal RCS for a row address strobe from a memory controller, and a separate second chip selection signal input pin 44 for receiving a second chip selection signal CCS for a column address strobe from a memory controller. The figure shows only pins associated with data input and the actual arrangement shown is not critical to the invention.

According to a preferred embodiment of the present invention, the semiconductor memory device 400 also separately includes a row command input pin 45 for receiving a row command RC from a memory controller, and a column command input pin 46 for receiving a column address strobe CC from a memory controller.

The semiconductor memory device 400 also separately includes a plurality of row address input pins 47-1 through 47-n for receiving row addresses RAi (where i is an integer from 1 to n) from a memory controller, and a plurality of column address input pins 48-1 through 48-n for receiving column addresses CAi (where i is an integer from 1 to n) from a memory controller.

The semiconductor memory device 400 further includes a clock input pin 41 for receiving a clock signal CK to synchronize signals received via the above-described pins, a clock enable pin 42 for receiving a clock enable signal CKE, and a plurality of data input output pins 49-1 through 49-n for receiving data DQi (where i is an integer from 1 to n) from a memory controller or outputting data DQi (where i is an integer from 1 to n) to a memory controller. Preferably, the clock signal CK and the clock enable signal CKE are generated by the memory controller. However, they can be generated by other logic circuits as necessary.

In particular, the semiconductor memory device 400 according to a preferred embodiment of the present invention receives the row command RC and the column command CC in two ticks of a clock signal. In other words, the row command RC and the column command CC are input to the semiconductor memory device in response to two consecutive edges of a clock signal CK. Also, the row addresses RAi (where i is an integer from 1 to n) and the column addresses CAi (where i is an integer from 1 to n) are each input to the semiconductor memory device in two ticks of a clock signal, that is, in response to the two consecutive edges of a clock signal CK. The first chip selection signal RCS for a row address strobe, and the second chip selection signal CCS for a column address strobe are each input to the semiconductor memory device in two ticks of a clock signal, that is, in response to the two consecutive edges of a clock signal CK.

In the semiconductor memory device 400 according to a preferred embodiment of the present invention, an active operation is performed by the first logic level of the row command RC, and a precharging operation is performed by the second logic level of the row command RC. Also, reading is performed by the first logic level of the column command CC, and writing is performed by the second logic level of the column command CC. Here, the first logic level is a logic "low", and the second logic level is a logic "high". However, the semiconductor memory device according to the present invention can be structured so that the first logic level is a logic "high", and the second logic level is a logic "low", as desired.

In the semiconductor memory device 400, the first data of the first chip selection signal RCS received in response to a first tick, that is, a first edge of the clock signal CK, is recognized as a chip selection signal, and the second data of the first chip selection signal RCS received in response to a second tick, that is, a second edge of the clock signal CK, is recognized as a row command. Also, the first data of the second chip selection signal CCS is received in response to another first tick, that is, another first edge of the clock signal CK is recognized as a chip selection signal and the second data of the second chip selection signal CCS received in response to another second tick (another second edge of the clock signal CK is recognized as a column command).

Figure 5:
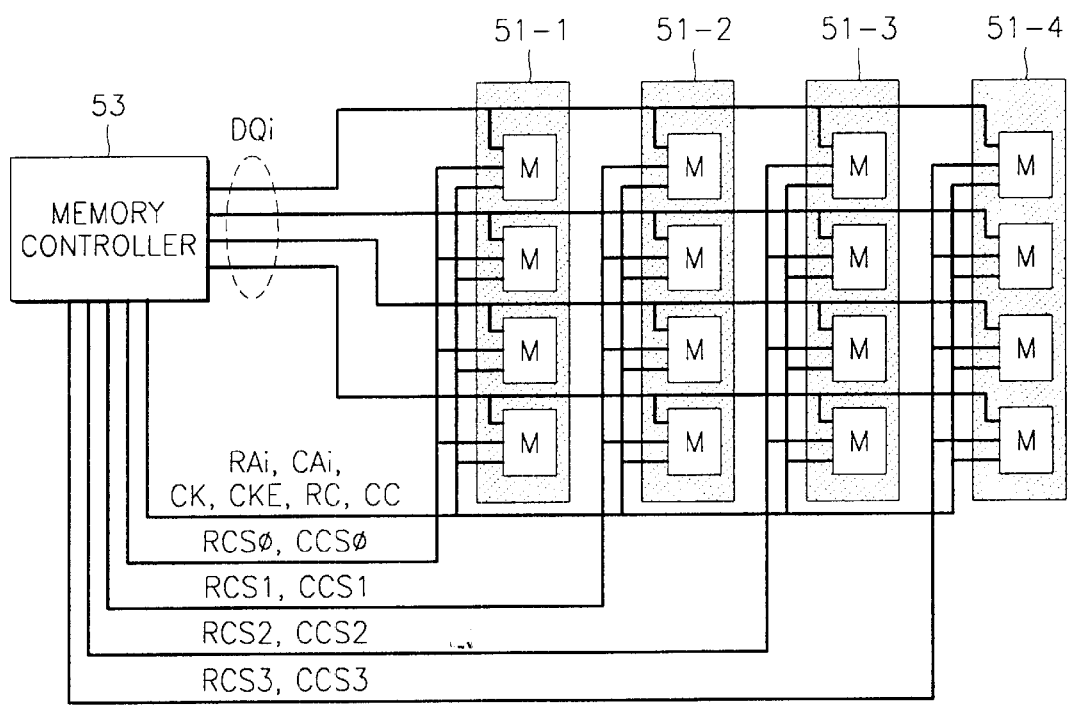
FIG. 5 illustrates a memory system according to the present invention having the semiconductor memory device of FIG. 4.

FIG. 5 is a view illustrating a memory system according to the present invention adopting the semiconductor memory device shown in FIG. 4, Referring to FIG. 5, the memory system according to an embodiment of the present invention includes memory modules 51-1 through 51-4 on each of which a plurality of semiconductor memory devices M are mounted, and a memory controller 53 for controlling the semiconductor memory devices M. Here, four memory modules are shown, and four semiconductor memory devices are mounted on each of the memory modules. Each of the semiconductor memory devices M is the semiconductor memory device of FIG. 4, and preferably has a pin configuration as shown in FIG. 4.

The memory controller 53 generates the first chip selection signal RCS for a row address strobe and the second chip selection signal CCS for a column address strobe. The first and second chip selection signals RCS and CCS are applied to each of the memory modules 51-1 through 51-4 via different bus lines. In FIG. 5, RCS0 and CCS0 are for application to the memory module 51-1, RCS1 and CCS1 are for application to the memory module 51-2, RCS2 and CCS2 are for the memory module 51-3, and RCS3 and CCS3 are for the memory module 51-4.

The memory controller 53 generates a row command RC and a column command CC and transmits the two commands to each of the semiconductor memory devices M via separate bus lines. The memory controller 53 also generates a row address RAi (where i is an integer from 1 to n) and a column address CAi (where i is an integer from 1 to n) and transmits the two addresses to each of the semiconductor memory devices M via respective separate bus lines. The memory controller 53 also generates a clock signal CK and a clock enable signal CKE and transmits the two signals to each of the semiconductor memory devices M via divided bus lines. It is apparent to one skilled in the art that the CK and CKE signals can be generated by other logic circuits instead of generated for the memory controller.

During a write operation, data Dqi (where i is an integer from 1 to n) output by the memory controller 53, that is, write data, is written to one of the memory device selected from the semiconductor memory devices M via data bus lines. During a read operation, data DQi is read from one of the memory devices selected among the semiconductor memory devices M, that is, read data, is transmitted to the memory controller 53 via data bus lines.

Figure 6:
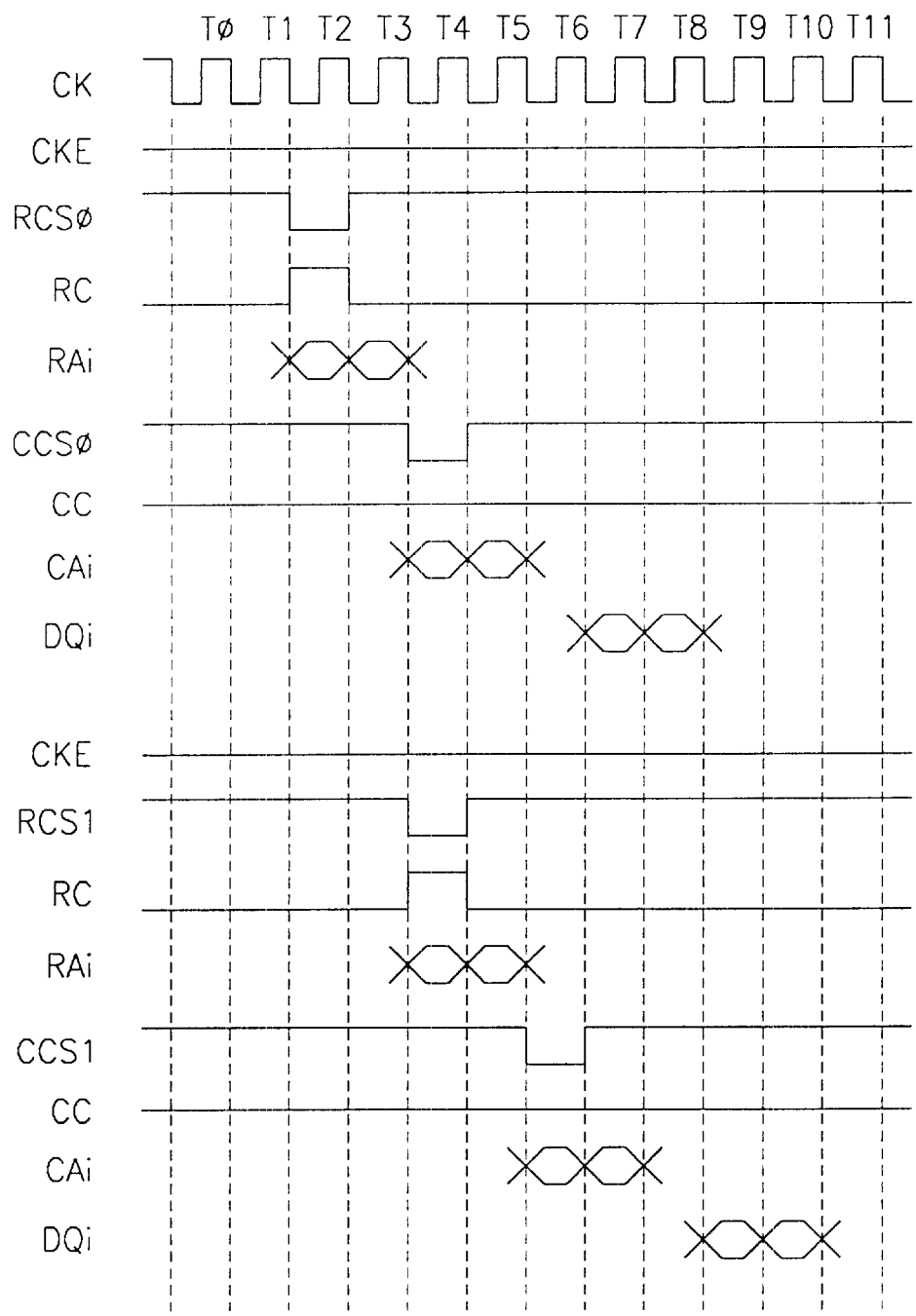
FIGS. 6 and 7 are timing diagrams illustrating protocols used in the memory system according to the present invention shown in FIG. 5 during a read operation.
Figure 7:
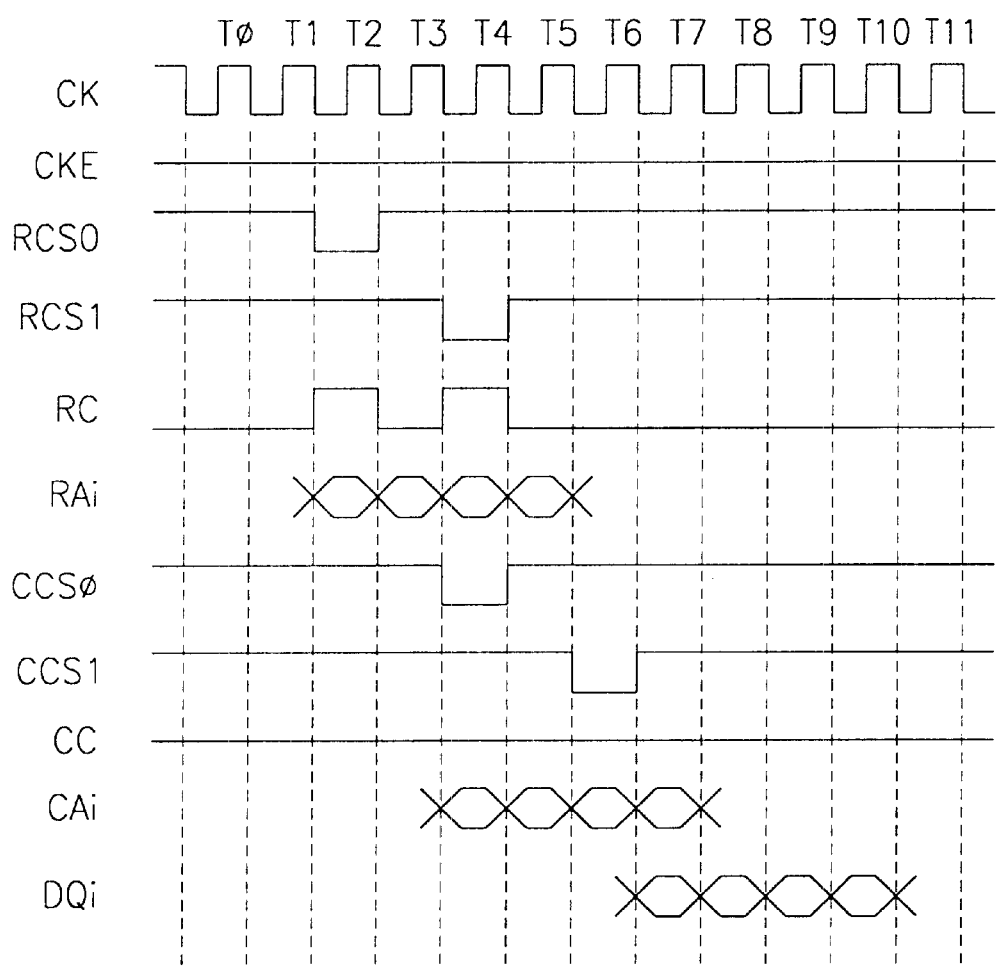

FIGS. 6 and 7 show timing diagrams illustrating protocols for a read operation in the memory system according to the embodiment as shown in FIG. 5. Here, an example of data being read from the two memory modules 51-1 and 51-2 among the memory modules shown in FIG. 5 is depicted. In FIG. 6, a read timing diagram with respect to the memory module 51-1, and a read timing diagram with respect to the memory module 51-2 are separately shown. In FIG. 7, a read timing diagram with respect to the memory module 51-1, and a read timing diagram with respect to the memory module 51-2 are shown together.

In FIGS. 6 and 7, it is assumed that tRCD—the time from activation (that is, a point in time of transition from a logic "high" to a logic "low") of the first chip selection signal RCS for a row address strobe to the point of time of activation of the second chip selection signal CCS for a column address strobe—is two clock cycles (2T), that a column address strobe latency CL is two clock cycles (2T), and that a burst length BL is two clock cycles (2T).

A read operation of the memory system shown in FIG. 5 will now be described referring to the timing diagram of FIG. 6. First, in order to access a particular semiconductor memory device of the memory module 51-1, RCS0 is activated to a logic "low" level in cycle T2, while RC is activated to a logic "high" level. In cycles T2 and T3, two consecutive row addresses RAi are input to the memory module 51-1. Next, CCS0 is activated to the logic "low" level in cycle T4, and two consecutive column addresses CAi are input to the memory module 51-1 in cycles T4 and T5. Meanwhile, CC remains at the logic "low" state. Accordingly, at cycles T7 and T8, two consecutive data DQi are read from a semiconductor memory device on the memory module 51-1.

To access a particular semiconductor memory device of the memory module 51-2, RCS1 is activated to the logic "low" level in cycle T4, while RC is activated to the logic "high" level. In cycles T4 and T5, two consecutive row addresses RAi are input to the memory module 51-2. Next, CCS1 is activated to the logic "low" level in cycle T6, and two consecutive column addresses CAi are input to the memory module 51-2 in cycles T6 and T7. Meanwhile, CC remains at the logic "low" state. Accordingly, in cycles T9 and T10, two consecutive data DQi are read from a semiconductor memory device of the memory module 51-2.

Hence, in the memory system according to the present invention, when data is read from the two memory modules 51-1 and 51-2, four data DQi on a data bus are consecutively read as shown in the timing diagrams of FIGS. 6 and 7, and thus there are no data-empty spaces on the data bus, thereby resulting in improved bus efficiency.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A memory device which is controlled by a memory controller, comprising:
   a clock input pin for receiving a clock signal;
   a first chip selection signal input pin for receiving a first chip selection signal for a row address strobe from the memory controller;
   a second chip selection signal input pin for receiving a second chip selection signal for a column address strobe from the memory controller;
   at least one row command input pin for receiving a row command from the memory controller;
   at least one column command input pin for receiving a column command from the memory controller;
   a plurality of row address input pins for receiving row addresses from the memory controller; and
   a plurality of column address input pins for receiving column addresses from the memory controller;
   wherein the row command and the column command are received in response to two consecutive edges of the clock signal, in synchronization with the first and second chip selection signals, respectively.

2. The memory device of claim 1, wherein the row address and the column address are received in response to two consecutive edges of the clock signal, in synchronization with the first and second chip selection signals, respectively.

3. The memory device of claim 1, wherein the first data of the first chip selection signal received in response to the first edge of the clock signal is recognized as a chip selection signal, and the second data of the first chip selection signal received in response to the second edge next to the first edge is recognized as a row address strobe command.

4. The memory device of claim 1, wherein the first data of the second chip selection signal received in response to the first edge of the clock signal is recognized as a chip selection signal, and the second data of the second chip selection signal received in response to the second edge of the clock signal, which is next to the first edge of the first signal, is recognized as a column address strobe command.

5. The memory device of claim 1, wherein the plurality of row address input pins and the plurality of column address input pins receive a portion of the row addresses and a portion of the column addresses being active at the same time.

6. The memory device which is controlled by a memory controller, comprising:

a clock input pin for receiving a clock signal;

a first chip selection signal input pin for receiving a first chip selection signal from the memory controller;

a second chip selection signal input pin for receiving a second chip selection signal from the memory controller;

at least one first command input pin for receiving a first command from the memory controller;

at lease one second command input pin for receiving a second command from the memory controller;

a plurality of first address input pins for receiving first addresses from the memory controller; and a plurality of second address input pins for receiving second addresses from the memory controller, wherein the first and second commands are received in response to at least one edge of the clock signal, in synchronization with the first and second chip selection signals, respectively, the first and second addresses are received in response to at least one edge of the clock signal, in synchronization with the first and second chip selection signals, respectively, and the plurality of first address input pins and the plurality of second address input pins receive a portion of first addresses and a portion of second addresses being active at the same time.

7. A memory system having memory modules on which a plurality of semiconductor memory devices are mounted, and a memory controller for controlling the semiconductor memory devices, wherein each of the semiconductor memory devices comprises:

a first chip selection signal input pin for receiving a first chip selection signal; and a second chip selection signal input pin for receiving a second chip selection signal;

at least one first command input pin for receiving a first command;

at least one second command input pin for receiving a second command;

a plurality of first address input pins for receiving first addresses;

a plurality of second address input pins for receiving second addresses;

wherein the first and second chip selection signals are generated by the memory controller and transmitted to each of the memory modules via different bus lines, a bus line for transmitting the first command is separated from a bus line for transmitting the second command, bus lines for transmitting the first addresses are separated from bus lines for transmitting the second addresses, and the plurality of first address input pins and the plurality of second address input pins receive a portion of first addresses and a portion of second addresses being active at the same time.

8. A memory system having memory modules on which a plurality of semiconductor memory devices are mounted, and a memory controller for controlling the semiconductor memory devices, wherein each of the semiconductor memory devices comprises a plurality of chip selection signal input pins for receiving their respective chip selection signals and a plurality of command input pins for receiving respective commands, wherein the chip selection signals are generated by the memory controller and transmitted to their respective memory modules via different bus lines, and bus lines for transmitting the respective commands are separated from each other.

9. A method of memory data access for a plurality of memories in a semiconductor memory array, comprising the steps of:

receiving at a first pin of a first memory a first chip selection signal for a row address strobe;

receiving at a second pin of the first memory a second chip selection signal for a column address strobe;

receiving at least one row command pin of the first memory a row command;

receiving at least one column command pin of the first memory a column command;

receiving at row address pins of the first memory row addresses; and receiving at column address pins of the first memory column addresses.

10. The method of claim 9, wherein the row command and the column command are received from a memory controller via separate bus lines.

11. The method of claim 9, wherein the row addresses and the column addresses are separately received from separate address lines.

12. The method of claim 9, wherein the first chip selection signal and the second chip selection signal are received via separate bus lines.

13. The method of claim 9, wherein the step of receiving the first memory row addresses and the step of receiving the first memory column addresses is active at the same time at the plurality of row address input pins and the plurality of column address input pins.

* * * * *